(12) United States Patent
Kim

(10) Patent No.: US 12,389,552 B2
(45) Date of Patent: Aug. 12, 2025

(54) PRINTED CIRCUIT BOARD

(71) Applicant: SAMSUNG ELECTRO-MECHANICS CO., LTD., Suwon-si (KR)

(72) Inventor: Jung Soo Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 217 days.

(21) Appl. No.: 18/223,636

(22) Filed: Jul. 19, 2023

(65) Prior Publication Data

US 2024/0164026 A1 May 16, 2024

(30) Foreign Application Priority Data

Nov. 16, 2022 (KR) .................. 10-2022-0153871
Feb. 6, 2023 (KR) .................. 10-2023-0015630

(51) Int. Cl.
*H05K 3/40* (2006.01)
*H05K 1/11* (2006.01)
*H05K 1/18* (2006.01)
*H05K 3/34* (2006.01)

(52) U.S. Cl.
CPC .......... *H05K 3/4007* (2013.01); *H05K 1/113* (2013.01); *H05K 1/181* (2013.01); *H05K 3/3452* (2013.01); *H05K 3/3457* (2013.01); *H05K 2201/099* (2013.01); *H05K 2201/10295* (2013.01); *H05K 2201/10689* (2013.01); *H05K 2203/168* (2013.01)

(58) Field of Classification Search
CPC ........ H05K 3/40; H05K 3/4007; H05K 1/113; H05K 1/181; H05K 3/3452; H05K 3/3457
USPC ........................................ 174/250
See application file for complete search history.

(56) References Cited

FOREIGN PATENT DOCUMENTS

JP      2019-102523 A    6/2019
KR   10-2015-0060037 A    6/2015

*Primary Examiner* — Tremesha W Burns
(74) *Attorney, Agent, or Firm* — MORGAN, LEWIS & BOCKIUS LLP

(57) ABSTRACT

A printed circuit board includes an insulating layer; an interconnection layer disposed on the insulating layer, and including a plurality of metal pads for mounting a semiconductor chip thereon; and a solder resist layer disposed on the insulating layer and covering the interconnection layer, the solder resist layer having a plurality of openings respectively exposing at least a portion of at least one of the plurality of metal pads. A rectangular region created by substantially connecting outer edges of outermost openings among the plurality of openings in a straight line is substantially equally divided into a plurality of cells, and a ratio of areas of the metal pads disposed in each cell to an area of each cell is calculated, and when a maximum value thereof is $P_{Max}$ and a minimum value thereof is $P_{Min}$, $(P_{Max}-P_{Min})*100 \leq 20$.

32 Claims, 6 Drawing Sheets

PRINTED CIRCUIT BOARD

CROSS-REFERENCE TO RELATED APPLICATION(S)

This application claims benefit of priority to Korean Patent Application Nos. 10-2022-0153871 filed on Nov. 16, 2022 in the Korean Intellectual Property Office and 10-2023-0015630 filed on Feb. 6, 2023 in the Korean Intellectual Property Office, the disclosures of which are incorporated herein by reference in their entirety.

TECHNICAL FIELD

The present disclosure relates to a printed circuit board.

BACKGROUND

Due to recent high-speed data processing, an increase in an amount of data, and the like, a demand for flip-chip BGA (FCB) substrates is increasing even in areas other than the existing central processing unit (CPU) market. For example, demand in various markets such as for electric vehicles, servers, and the like, is increasing, and accordingly, a package structure is diversifying from an existing CPU-oriented product structure to a more diverse product structure. Due to the diversification of such products, there is demand for various design package substrates, and density of each layer design is also higher than before. In particular, in the case of server package products, for which demand has particularly increased recently, the substrate size tends to increase. Meanwhile, as the substrate size increases, the number of bumps increases, which makes it more difficult to secure a constant bump height.

SUMMARY

An aspect of the present disclosure is to provide a printed circuit board capable of improving process capability by securing flatness of a bump region.

According to an aspect of the present disclosure, provided is a printed circuit board, the printed circuit board including: an insulating layer; an interconnection layer disposed on the insulating layer, and including a plurality of metal pads for mounting a semiconductor chip thereon; and a solder resist layer disposed on the insulating layer and covering the interconnection layer, the solder resist layer having a plurality of openings respectively exposing at least a portion of at least one of the plurality of metal pads. A rectangular region created by substantially connecting outer edges of outermost openings among the plurality of openings in a straight line is substantially equally divided into a plurality of cells, and a ratio of areas of the metal pads disposed in each cell to an area of each cell is calculated, and when a maximum value thereof is $P_{Max}$ and a minimum value thereof is $P_{Min}$, $(P_{Max}-P_{Min})*100 \leq 20$.

According to an aspect of the present disclosure, provided is a printed circuit board, the printed circuit board including: an insulating portion; a plurality of metal pads disposed on the insulating portion, and for mounting a semiconductor chip thereon; and a first solder resist layer disposed on the insulating portion and covering the plurality of metal pads, the first solder resist layer having a plurality of first openings respectively exposing at least a portion of at least one of the plurality of metal pads. A rectangular region created by substantially connecting outer edges of outermost first openings among the plurality of first openings in a straight line is substantially equally divided into n cells within a range having a horizontal length of 1.7 mm to 2.0 mm and a vertical length of 1.7 mm to 2.0 mm, and a ratio of areas of the metal pads disposed in each cell to a total area of the rectangular region is calculated, and when a maximum value thereof is $Q_{Max}$ and a minimum value thereof is $Q_{Min}$, $n*(Q_{Max}-Q_{Min})*100 \leq 20$, where n is a positive integer.

According to an aspect of the present disclosure, provided is a printed circuit board, the printed circuit board including: an insulating layer; an interconnection layer disposed on the insulating layer, and including a plurality of metal pads for mounting a semiconductor chip thereon; and a solder resist layer disposed on the insulating layer and covering the interconnection layer, the solder resist layer having a plurality of openings respectively exposing at least a portion of at least one of the plurality of metal pads. A rectangular region created by substantially connecting outer edges of outermost openings among the plurality of openings in a straight line is substantially equally divided into a plurality of cells, an average depth of the openings in each of the plurality of cells is $t_1, t_2, \ldots t_n$, respectively, and a ratio of an area of the metal pads disposed in each cell to an area of each cell are $P_1, P_2, \ldots P_n$, respectively, where n is an integer equal to or greater than 3, $t_1, t_2, \ldots t_n$ substantially satisfy a relationship of $0.22*\{(P_1, P_2, \ldots P_n)*100\}*(\mu m)+m*(\mu m)$, respectively, where, m is a rational number equal to or greater than 0.

According to an aspect of the present disclosure, provided is a printed circuit board, the printed circuit board including: an insulating portion; a plurality of metal pads disposed on the insulating portion, and for mounting a semiconductor chip thereon; and a solder resist layer disposed on the insulating portion and covering the plurality of metal pads, the solder resist layer having a plurality of openings respectively exposing at least a portion of at least one of the plurality of metal pads. A rectangular region created by substantially connecting outer edges of outermost openings among the plurality of openings in a straight line is substantially equally divided into n cells within a range having a horizontal length of 1.7 mm to 2.0 mm and a vertical length of 1.7 mm to 2.0 mm, an average depth of the openings in each of the plurality of cells is $t_1, t_2, \ldots t_n$, respectively, and a ratio of an area of the metal pads disposed in each cell to a total area of the rectangular region is $Q_1, Q_2, \ldots Q_n$, respectively, where n is an integer equal to or greater than 3, $t_1, t_2, \ldots t_n$ substantially satisfies a relationship of $0.22*n*\{(Q_1, Q_2, \ldots Q_n)*100\}*(\mu m)+k*(\mu m)$, respectively, where k is a rational number equal to or greater than 0.

According to an aspect of the present disclosure, provided is a method to determine whether a printed circuit board is suitable for a semiconductor chip mounted thereon. The printed circuit board includes an insulating layer, a plurality of metal pads disposed on the insulating layer, and a solder resist layer disposed on the insulating layer and having a plurality of openings respectively exposing at least a portion of at least one of the plurality of metal pads. The method includes: substantially equally dividing a rectangular region created by substantially connecting outer edges of outermost openings among the plurality of openings in a straight line into a plurality of cells; calculating a ratio of areas of the metal pads disposed in each cell to an area of each cell; and determining that the printed circuit board is suitable for the semiconductor chip mounted thereon based on a result that $(P_{Max}-P_{Min})*100$ is equal to or less than a predetermined value, where $P_{Max}$ is a maximum value among the ratios for the plurality of cells and $P_{Min}$ is a minimum value among the ratios for the plurality of cells.

BRIEF DESCRIPTION OF DRAWINGS

The above and other aspects, features, and advantages of the present disclosure will be more clearly understood from the following detailed description taken in conjunction with the accompanying drawings.

DETAILED DESCRIPTION

Hereinafter, exemplary embodiments of the present disclosure will be described in detail with reference to the accompanying drawings. Further, these embodiments are provided so that this disclosure will be thorough and complete, and will fully convey the scope of the disclosure to those skilled in the art.

Electronic Device

Figure 1:
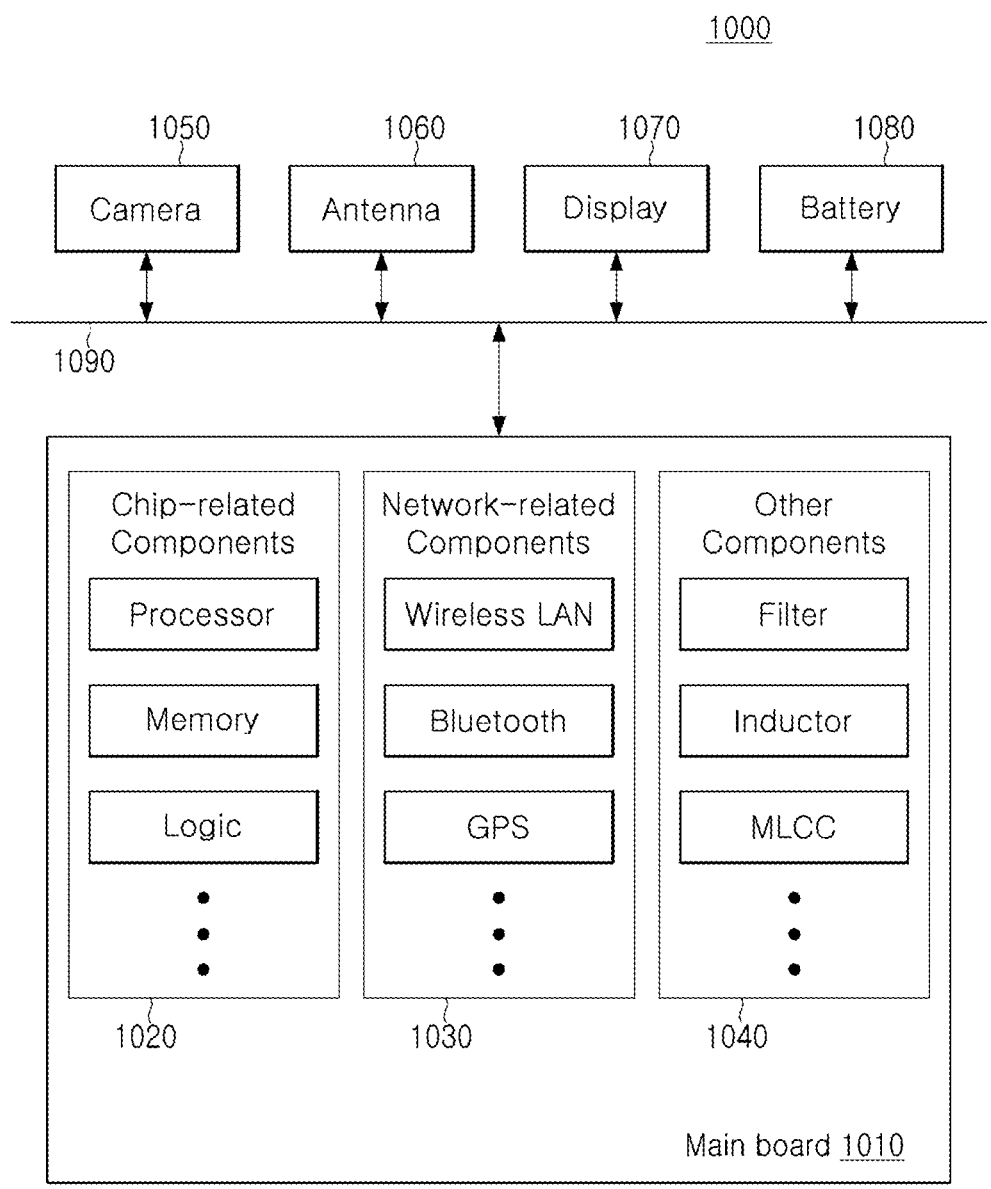
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mainboard 1010. The mainboard 1010 may include chip-related components 1020, network-related components 1030, other components 1040, or the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip-related components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
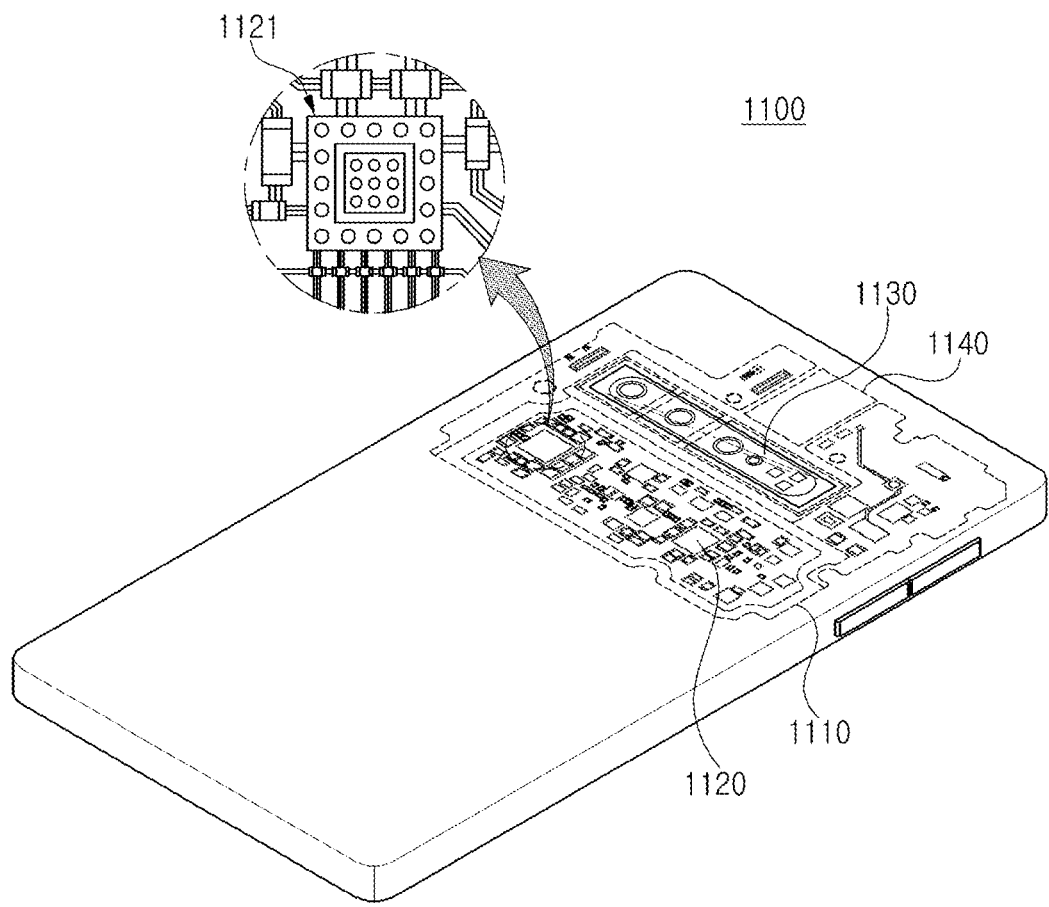
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A motherboard 1110 is accommodated inside the smartphone 1100, and various components 1120 are physically and/or electrically connected to the motherboard 1110. In addition, other components that may or may not be physically and/or electrically connected to the motherboard 1110 are accommodated therein, such as the camera module 1130 and/or the speaker 1140. A portion of the component 1120 may be the aforementioned chip-related component, for example, a component package 1121, but an embodiment thereof is not limited thereto. The component package 1121 may be in a form of a printed circuit board on which an electronic component including an active component and/or a passive component are surface-mounted.

Alternatively, the component package 1121 may be in a form of a printed circuit board in which an active component and/or a passive component are embedded. Meanwhile, the electronic device is not necessarily limited to the smartphone 1100, and may be other electronic devices as described above.

Printed Circuit Board

Figure 3:
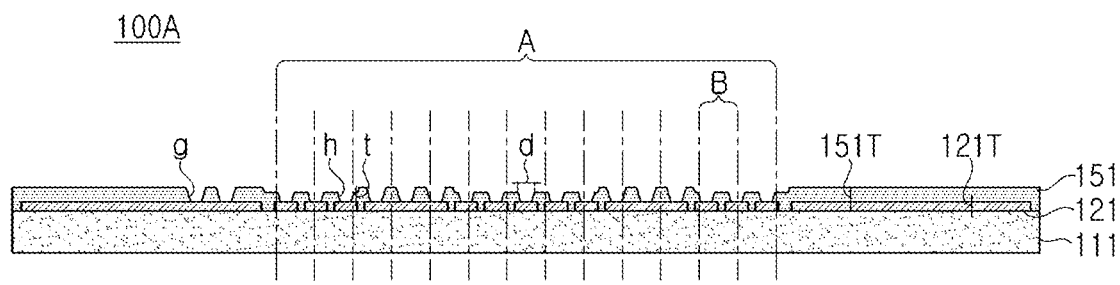
FIG. 3 is a cross-sectional view schematically illustrating an example of a printed circuit board.

FIG. 3 is a cross-sectional view schematically illustrating an example of a printed circuit board.

Figure 4:
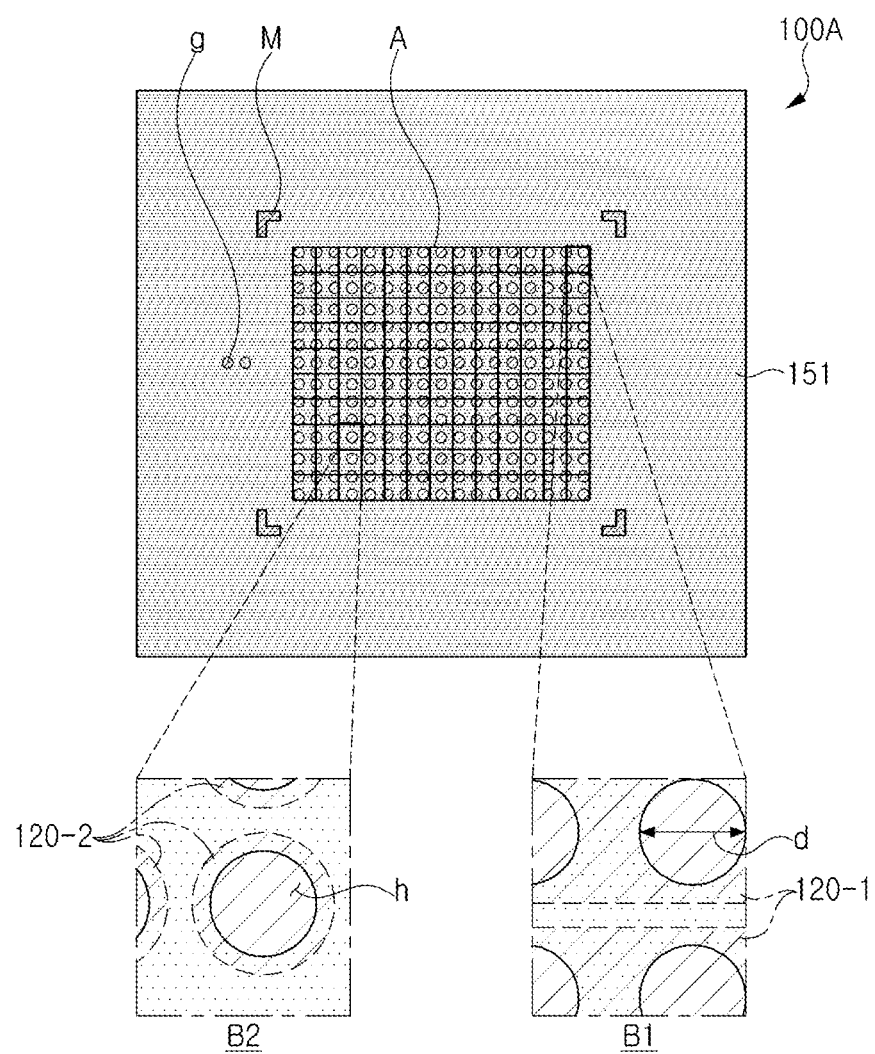
FIG. 4 is a plan view illustrating a schematic top view of the printed circuit board of FIG. 3.

FIG. 4 is a plan view illustrating a schematic top view of the printed circuit board of FIG. 3.

Referring to FIGS. 3 and 4, a printed circuit board 100A according to an example may include an insulating layer 111, an interconnection layer 121 disposed on the insulating layer 111, and a solder resist layer 151 disposed on the insulating layer 111 and covering the interconnection layer 121 and having a plurality of openings (h and g) respectively exposing at least a portion of the interconnection layer 121. The interconnection layer 121 may include a plurality of metal pads for mounting a semiconductor chip, and may further include a plurality of metal pads for mounting a passive component, if necessary. The solder resist layer 151 may cover a plurality of metal pads. The plurality of openings h may respectively expose at least a portion of at least one of the plurality of metal pads for mounting a semiconductor chip. The plurality of openings g may respectively expose at least a portion of at least one of the plurality of metal pads for mounting a passive component. Each of the plurality of metal pads may include copper (Cu). The solder resist layer 151 may further have a reference mark M for mounting a semiconductor chip. The reference mark M may penetrate through at least a portion of the solder resist layer 151, and may expose at least a portion of the insulating layer 111 and/or the interconnection layer 121.

Meanwhile, a rectangular region A created by substantially connecting outer edges of outermost openings among the plurality of openings h in a straight line is substantially equally divided into a plurality of cells B, and a ratio of an area of an interconnection layer 121 disposed in each cell B to an area of each cell B, is calculated, and in this case, when a ratio of an area of a metal pad 120-1 for mounting a semiconductor chip to an area of a cell B1 having the largest area ratio, wherein B1 is a cell in which the metal pad 120-1 for mounting a semiconductor chip is formed to be the largest is $P_{Max}$, and when a ratio of an area of a metal pad 120-2 for mounting a semiconductor chip to an area of a cell B2 having the smallest area ratio, wherein B2 is a cell in which the metal pad 120-2 for mounting a semiconductor chip is formed to be the smallest is $P_{Min}$, $(P_{Max}-P_{Min})*100 \leq 20$.

In this case, when an average depth (t) of the openings (h) in each cell B, is $t_1, t_2, \ldots t_n$, respectively, and a ratio P of an area of the interconnection layer 121 disposed in each cell B to the area of each cell B, for example, the area of the metal pad for mounting a semiconductor chip is calculated, is $P_1, P_2, \ldots P_n$, respectively, where n is an integer equal to or greater than 3, $t_1, t_2, \ldots t_n$ may substantially satisfy a relationship of $0.22*\{(P_1, P_2, \ldots P_n)*100\}*(\mu m)+m*(\mu m)$, respectively where m may be a rational number equal to or greater than 0.

Alternatively, a rectangular region A created by substantially connecting outer edges of outermost openings among the plurality of openings h in a straight line is substantially equally divided into n cells B, and a ratio of the interconnection layer 121 disposed in each cell B to a total area of the rectangular region A, for example, the area of the metal pad for mounting a semiconductor chip is calculated, and in this case, when a ratio of an area of a metal pad 120-1 for mounting a semiconductor chip to a total area of the rectangular region A in a cell B1 having the largest area ratio, wherein B1 is a cell in which the metal pad 120-1 for mounting a semiconductor chip is formed to be the largest is $Q_{Max}$, and when a ratio of an area of a metal pad 120-2 for mounting a semiconductor chip to a total area of the rectangular region A in a cell B2 having the smallest area ratio, wherein B2 is a cell in which the metal pad 120-2 for mounting semiconductor c chip is formed to be the smallest is $Q_{Min}$, $n*(Q_{Max}-Q_{Min})*100 \leq 20$, where n may be a positive integer.

In this case, when an average depth (t) of the opening (h) in each cell B, is $t_1, t_2, \ldots t_n$, respectively, and a ratio P of an area of the interconnection layer 121 disposed in each cell B to the total area of each cell B, for example, the area of the metal pad for mounting a semiconductor chip is calculated, is $Q_1, Q_2, \ldots Q_n$, respectively, and when n is an integer equal to or greater than 3, $t_1, t_2, \ldots t_n$ may substantially satisfy a relationship of $0.22*n*\{(Q_1, Q_2, \ldots Q_n)*100\}*(\mu m)+k*(\mu m)$, respectively, where k may be a rational number equal to or greater than 0.

Meanwhile, when defining the rectangular region A, a portion partially protruding or partially recesses, of the outer edges of the outermost openings among the plurality of openings (h) on a plane may be excluded when drawing a virtual line. In addition, an angle at which different virtual straight lines meet may be substantially a right angle. For example, the rectangular region A may have a substantially rectangular or square shape on a plane. As will be described later, the rectangular region A may be a bump region in which a solder bump for mounting a semiconductor chip is formed. Therefore, when defining the rectangular region A, a plurality of openings (g) or a reference mark (M) may be excluded. For example, the reference mark M is for mounting a semiconductor chip, and may be respectively formed at at least one corner, preferably near four corners, of the rectangular region A in which the semiconductor chip is mounted, and the plurality of openings (g) is a region for exposing a metal pad for mounting passive components, and may be formed around the rectangular region A.

Meanwhile, the plurality of cells (B) are regions, obtained by equally dividing the rectangular region (A), and a horizontal and/or vertical size, which is a criterion for division, may be determined in a range of 1.7 mm to 2.0 mm, respectively, and when there are several cases, a case that can be divided into the smallest sizes may be adopted. For example, in the case of dividing a rectangular region A having a horizontal and/or vertical length of 31 mm, each cell B may be divided into a case of having a horizontal and/or vertical length of about 1.72 mm (18 divisions), 1.82 mm (17 divisions), 1.94 mm (16 divisions), and the like, and the above-described parameters according to the present disclosure may be calculated by dividing the rectangular region A into 1.72 m (18 divisions), in which the rectangular region A is divided into the smallest sizes thereamong. According to analysis and experimentation, a relation of the above-described parameters according to the present disclosure can be derived preferably when dividing the cell B into this range.

Meanwhile, in the printed circuit board 100A according to an example, the parameters according to the present disclosure described above may be calculated by defining a rectangular region A and a plurality of cells B, and measuring areas thereof, and then penetrating a solder resist layer 151 and measuring an area of an interconnection layer 121 disposed in each cell (B) region, for example, an area of a metal pad, or removing the solder resist layer 151 and then measuring the interconnection layer 121 disposed in each cell (B) region, for example, the area of the metal pad. When measuring the area, a scanning microscope or an optical microscope may be used, but the measuring method is not limited thereto.

Meanwhile, an average thickness 121T of the interconnection layer 121 may be in a range of 1.0 μm to 18 μm, and a difference between a maximum thickness and a minimum thickness in the interconnection layer 121 may be within about 5 μm. In addition, an average thickness 151T of the solder resist layer 151 may be 15 μm to 23 μm, and a difference between the maximum thickness and the minimum thickness in the solder resist layer 151 may be within about 7 μm. In addition, an average diameter (d) of the plurality of openings (h) may be 50 μm to 100 μm, and a difference in diameters between an opening having the largest diameter and an opening having the smallest diameter among the plurality of openings (h) may be within about 10 μm. When the thickness, diameter, depth, and the like, satisfy these conditions, the relationship of the above-described parameters according to the present disclosure may be preferably derived.

Meanwhile, the average thickness 121I of the interconnection layer 121, the average thickness 151I of the solder resist layer 151, the average diameter (d) of the plurality of openings (h), the average depth (t) of the plurality of openings (h), and the like may be measured using a scanning microscope or an optical microscope, but the measuring equipment is not limited thereto. If necessary, these values may be measured based on the polished or cut cross-section of the printed circuit board 1001. The average thickness, average diameter average depth, and the like, may be calculated as an average value of values measured at five arbitrary points. When each opening has a tapered shape, the diameter of each opening can be calculated as an average value of the uppermost and lowermost diameters of each opening.

Meanwhile, in the case of a method of forming bumps on a substrate using microballs, since a size of the balls is almost constant, a height of the bumps may be determined by a volume of an opening region of the solder resist layer on which the bumps are mounted. In this case, a depth of the opening region of the solder resist layer may be determined by a design of the lower region, for example, a metal ratio of the interconnection layer. Therefore, adjustment of the metal ratio of the interconnection layer in the bump region on which the semiconductor chip is mounted may be an important factor for controlling a distribution of the height of the bump. According to analysis and experimentation, when the above-described parameters according to the present disclosure are satisfied, it is possible to more easily control the distribution of the height of the bump, so that flatness of the bump region of a large-area product may be secured, and accordingly, a deviation in the height of the bump may be reduced by improving process capability. Thereby, it is possible to improve yield and quality of the assembly. In addition, it is possible to remove a fundamental cause of defects in a bump height during manufacturing a substrate, thereby improving the yield.

For example, in the case of forming solder bumps using microballs is, respectively, on the plurality of openings h of the printed circuit board 100A according to an example, when n openings h are formed to satisfy a relationship of $t_1 \ldots t_n \approx 0.22*\{(P_1 \ldots P_n)*100\}+m$ and/or $t_1 \ldots t_n \approx 0.22*n*\{(Q_1 \ldots Q_n)*100\}+k$, and as in Experimental Examples 1 to 5 of [Table 1] and [Table 2] below, when $(P_{Max}-P_{Min})*100$ and/or $n*(Q_{Max}-Q_{Min})*100$ are 20 or less, a tolerance of the solder bump is within ±10 μm, so a sufficient margin can be secured, so that the specifications required for the package substrate before mounting the semiconductor chip can be satisfied.

On the other hand, as in Experimental Examples 6 to 7 in [Table 1] and [Table 2] below, when the value of $(P_{Max}-P_{Min})*100$ and/or $n*(Q_{Max}-Q_{Min})*100$ exceeds 20, a height tolerance of the solder bump exceeds ±10 μm, and as a result, defects that do not meet the delivery standards may occur, such as not being able to satisfy the specifications required for the package substrate before mounting the semiconductor chip.

TABLE 1

| | Division | | |
|---|---|---|---|
| | Area of rectangular region (Horizontal size * Longitudinal size) | Area of each cell (Horizontal size * Longitudinal size) | The number of cells, N (Horizontal size * Longitudinal size) |
| Experimental Example 1 | 31 mm * 31 mm | 1.72 mm * 1.72 mm | 18 * 18 |
| Experimental Example 2 | 31 mm * 31 mm | 1.72 mm * 1.72 mm | 18 * 18 |
| Experimental Example 3 | 31 mm * 31 mm | 1.72 mm * 1.72 mm | 18 * 18 |
| Experimental Example 4 | 31 mm * 31 mm | 1.72 mm * 1.72 mm | 18 * 18 |
| Experimental Example 5 | 31 mm * 31 mm | 1.72 mm * 1.72 mm | 18 * 18 |
| Experimental Example 6 | 31 mm * 31 mm | 1.72 mm * 1.72 mm | 18 * 18 |
| Experimental Example 7 | 31 mm * 31 mm | 1.72 mm * 1.72 mm | 18 * 18 |

TABLE 2

| | Division | | | |
|---|---|---|---|---|
| | $P_{Max} - P_{Min}$ | $Q_{Max} - Q_{Min}$ | Bump height range | Whether or not defects occurred |
| Experimental Example 1 | 0.05 | $1.54 * 10^{-4}$ | 17 μm | — |
| Experimental Example 2 | 0.10 | $3.09 * 10^{-4}$ | 18 μm | — |
| Experimental Example 3 | 0.15 | $4.63 * 10^{-4}$ | 19 μm | — |
| Experimental Example 4 | 0.19 | $5.86 * 10^{-4}$ | 20 μm | — |
| Experimental Example 5 | 0.20 | $6.17 * 10^{-4}$ | 20 μm | — |
| Experimental Example 6 | 0.21 | $6.48 * 10^{-4}$ | 21 μm | Defects occurred |
| Experimental Example 7 | 0.25 | $7.72 * 10^{-4}$ | 22 μm | Defects occurred |

Meanwhile, in the samples of the printed circuit board in Experimental Examples 1 to 7 described above, an average thickness 121T of the interconnection layer 121 was about 15 μm, a difference between a maximum thickness and a minimum thickness was about 3 μm, an average thickness 151T of the solder resist layer 151 was about 20 μm, a difference between a maximum thickness and a minimum thickness was about 4 μm, an average diameter (d) of the plurality of openings (h) was about 75 μm, and a difference between a maximum diameter and a minimum diameter was about 5 μm. In addition, an ABF was used as the material of the insulating layer 111, the interconnection layer 121 was formed by chemical copper plating and electrolytic copper plating, and a product name AUE703 was used as the material of the solder resist layer 151.

Hereinafter, components of the printed circuit board 100A according to an example will be described in more detail with reference to the drawings.

The insulating layer 111 may include an insulating material. The insulating material may include a thermosetting resin such as an epoxy resin, a thermoplastic resin such as polyimide, or a material including an inorganic filler, an organic filler, and/or glass fiber (glass Cloth, glass Fabric) together with these resins. For example, the insulating material may be a non-photosensitive insulating material such as an Ajinomoto Build-up Film (ABF), prepreg (PPG), but the present disclosure is not limited thereto, and other polymer materials may be used. In addition, the insulating material may be a photosensitive insulating material such as Photo Imageable Dielectric (PID).

The interconnection layer 121 may include a metal. The metal may include copper (Cu), aluminum (Al), silver (Ag), tin (Sn), gold (Au), nickel (Ni), lead (Pb), titanium (Ti), and/or alloys thereof. Preferably, copper (Cu) may be included, but the present disclosure is not limited thereto. The interconnection layer 121 may perform various functions according to the design. For example, the interconnection layer 121 may include a signal pattern, a power pattern, and a ground pattern. Each of these patterns may include a line pattern, a pad pattern, a plane pattern, and the like. The interconnection layer 121 may include an electroless plating layer (or chemical copper) and an electrolytic plating layer (or electrolytic copper), but the present disclosure is not limited thereto. A sputter layer may be formed instead of the electroless plating layer, or both thereof may be included. In addition, copper foil may be further included.

The solder resist layer 151 may include solder resist. The solder resist may be a photosensitive material or may be a liquid type. For example, the solder resist may be a product name of AUS703, SR7300, or the like, but the present disclosure is not limited thereto. The solder resist layer 151 may have a plurality of openings h, and each of the openings h may expose at least a portion of the interconnection layer 121. Each of the openings (h) may expose at least a portion of the interconnection layer 121 in a solder mask defined (SMD) and/or non-solder mask defined (NSMD) type. Preferably, each of the openings h may expose at least a portion of the interconnection layer 121 in an SMD type.

Figure 5:
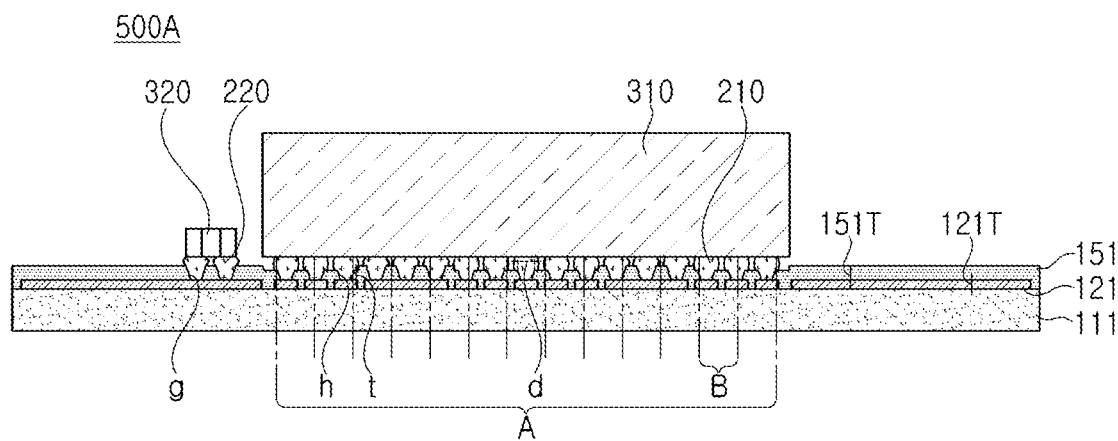
FIG. 5 is a schematic cross-sectional view of a modified example of the printed circuit board of FIG. 3.

FIG. 5 is a schematic cross-sectional view of a modified example of the printed circuit board of FIG. 3.

Figure 6:
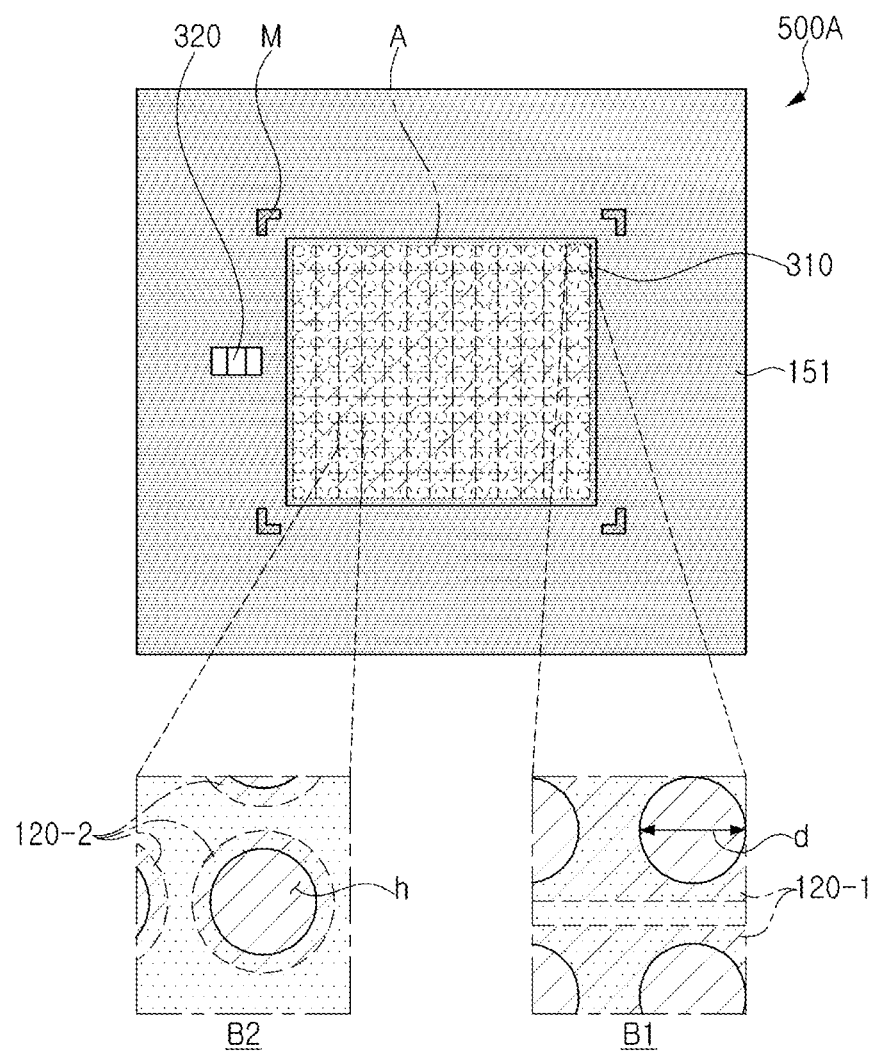
FIG. 6 is a plan view illustrating a schematic top view of the printed circuit board of FIG. 5.

FIG. 6 is a plan view illustrating a schematic top view of the printed circuit board of FIG. 5.

Referring to FIGS. 5 and 6, a printed circuit board 500A according to a modified example may include an insulating layer 111, an interconnection layer 121 disposed on the insulating layer 111, a solder resist layer 151 disposed on the insulating layer and covering at least a portion of the interconnection layer 121 and having a plurality of openings h respectively exposing at least a portion of the interconnection layer 121, a plurality of solder bumps 210 and 220 respectively disposed on the plurality of openings (h and g) and respectively connected to the at least portion of the exposed interconnection layer 121; and a semiconductor chip 310 and a passive component 320 disposed on the solder resist layer 151 and respectively connected to the interconnection layer 121 through the plurality of solder bumps 210 and 220. For example, the printed circuit board 500A according to the modified example may have a package shape including the printed circuit board 100A according to the example. For example, the printed circuit board 500A according to the modified example may have a semiconductor package structure.

Meanwhile, the plurality of solder bumps 210 and the semiconductor chip 310 may be disposed on a rectangular region A. For example, the rectangular region A may be a bump region in which a plurality of solder bumps 210 for mounting the semiconductor chip 310 are disposed. The printed circuit board 500A according to the modified example may also satisfy parameters according to the present disclosure described above, and in this case, the plurality of solder bumps 210 before the semiconductor chip 310 is mounted may have excellent flatness. For example, in the plurality of solder bumps 210 before the semiconductor chip 310 is mounted, a difference in heights between a solder bump having a maximum height and a solder bump having a minimum height may be within about 20 μm. In this case, since a deviation in a height of the bump may be reduced by improving process capability, yield and quality of an assembly may be improved, and the yield may be further improved by removing a fundamental cause of defects in the height of the bump during manufacturing a substrate.

Meanwhile, a height of each of the plurality of solder bumps 210 may be measured using a scanning microscope, an optical microscope, or the like, based on the printed circuit board 500A before the semiconductor chip 310 is mounted, but the measuring equipment is not limited thereto. If necessary, the height of each of the plurality of solder bumps 210 may be measured based on a polished or cut cross-section of the printed circuit board 500A before the semiconductor chip 310 is mounted.

Hereinafter, components of the printed circuit board 500A according to the modified example will be described in more detail with reference to the drawings.

Each of the plurality of solder bumps 210 and 220 may be formed of low-melting point metal, for example, solder such as tin (Sn)-aluminum (Al)-copper (Cu), but this is merely an example, and the material thereof is not particularly limited thereto. Each of the plurality of solder bumps 210 may have microball shape, but the present disclosure is not limited thereto.

The semiconductor chip 310 may include an integrated circuit (IC) die in which hundreds to millions of devices or more are integrated into a single chip. In this case, the integrated circuit may include, for example, an application processor (e.g., AP) such as a central processor (e.g., CPU), a graphics processor (e.g., GPU), a field programmable gate array (FPGA), a digital signal processor, a cryptographic processor, a microprocessor, or a microcontroller; a logic chip such as an analog-digital converter, or an application-specific integrated circuit (ASIC), but the present disclosure is not limited thereto; and a memory chip such as a volatile memory (e.g., a dynamic random access memory (DRAM)), a non-volatile memory (e.g., a read only memory (ROM)), a flash memory, or a high bandwidth memory (HBM), or may be other types such as a power management IC (PMIC). The number of semiconductor chips 310 may be plural, and in this case, semiconductor chips of the same type or different types may be respectively disposed on the rectangular region A.

The semiconductor chip 310 may be formed based on an active wafer, and in this case, silicon (Si), germanium (Ge), gallium arsenide (GaAs), or the like may be used as a base material constituting each body. Various circuits may be formed on the body. A connection pad may be formed on each body, and the connection pad may include a conductive material such as aluminum (Al) or copper (Cu). The semiconductor chip 310 may be a bare die, and in this case, metal bumps may be disposed on the connection pad, if necessary. The semiconductor chip 310 may be a packaged die. In this case, a redistribution layer may be additionally formed on the connection pad, and metal bumps may be disposed on the redistribution layer, if necessary.

The passive component 320 may be a component, for example, a high-frequency inductor, a ferrite inductor, a power inductor, ferrite beads, a low temperature co-firing ceramics (LTCC), an electromagnetic interference (EMI), a multi-layer ceramic capacitor (MLCC), and the like, but the present disclosure is not limited thereto.

Other contents are substantially the same as those described in the printed circuit board 100A according to the example described above, and thus, overlapping contents thereof are omitted.

Figure 7:
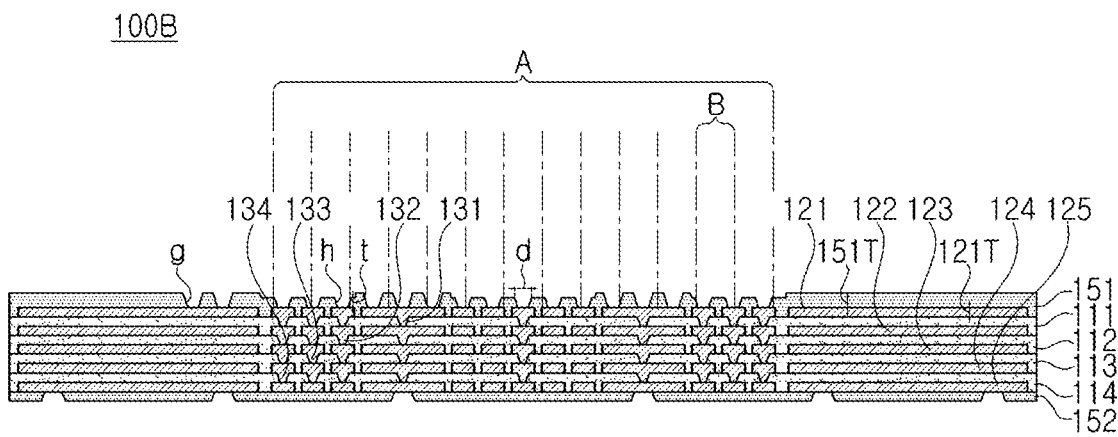
FIG. 7 is a schematic cross-sectional view of another example of a printed circuit board.

FIG. 7 is a schematic cross-sectional view of another example of a printed circuit board.

Referring to FIG. 7, a printed circuit board 100B according to another example may include a plurality of insulating layers 111, 112, 113, and 114, a plurality of interconnection layers 121, 122, 123, 124, and 125 disposed on or within the plurality of insulating layers 111, 112, 113, and 114, a plurality of via layers 131, 132, 133, and 134 respectively penetrating at least one of the plurality of insulating layers 111, 112, 113, and 114 and respectively connected to at least one of the plurality of interconnection layers 121, 122, 123, 124, and 125, and first and second solder resist layers 151 and 152 respectively disposed on upper sides and lower sides or the plurality of insulating layers 111, 112, 113, and 114. Referring to FIG. 7, the printed circuit board 100B according to another example may be a coreless-type multilayer board, but the present disclosure is not limited thereto, and may be a core-type multilayer board having a core layer if necessary.

Each of the plurality of insulating layers 111, 112, 113, and 114 may include an insulating material. The insulating material may include a thermosetting resin such as an epoxy resin, a thermoplastic resin such as polyimide, or a material including an inorganic filler, an organic filler, and/or a glass fiber (glass cloth, glass fabric), together with these resins. For example, the insulating material may be a non-photosensitive insulating material such as an Ajinomoto Build-up Film (ABF), prepreg (PPG), or the like, but the present disclosure is not limited thereto, and other polymer materials may be used. In addition, the insulating material may be a photosensitive insulating material such as a Photo Imageable Dielectric (PID).

Each of the plurality of interconnection layers 121, 122, 123, 124, and 125 may include a metal. The metal may include copper (Cu), aluminum (Al), silver (Ag), tin (Sn), gold (Au), nickel (Ni), lead (Pb), titanium (Ti), and/or alloys thereof. Preferably, the metal may include copper (Cu), but the present disclosure is not limited thereto. Each of the plurality of interconnection layers 121, 122, 123, 124, and 125 may perform various functions according to the design. For example, it may include a signal pattern, a power pattern, a ground pattern, and the like. Each of these patterns may have various shapes such as a line pattern, a plane pattern, a pad pattern, and the like. Each of the plurality of interconnection layers 121, 122, 123, 124, and 125 may include an electroless plating layer (chemical copper) and an electrolytic plating layer (or electrolytic copper). Alternatively, a metal foil (or copper foil) and an electrolytic plating layer (or electrolytic copper) may be included. Alternatively, a metal foil copper foil), an elect mmol plating layer (or chemical copper), and an plating layer (or electrolytic copper) may be included. A sputter layer may be included instead of the electroless plating layer (or chemical copper), and both thereof may be included if necessary.

Each of the plurality of via layers 131, 132, 133, and 134 may include a metal. The metal may include copper (Cu), aluminum (Al), silver (Ag), tin (Sn), gold (Au), nickel (Ni), lead (Pb), titanium (Ti), and/or alloys thereof. Preferably, the metal may include copper (Cu), but the present disclosure is not limited thereto. Each of the plurality of via layers 131, 132, 133, and 134 may include a filled via filling a via hole, but may also include a conformal via disposed along a wall surface of the via hole. Vias respectively included in the plurality of via layers 131, 132, 133, and 134 may perform various functions according to the design. For example, the vias may include a ground via, a power via, a signal via, and the like. The vias respectively included in the plurality of via layers 131, 132, 133, and 134 may have a tapered shape in the same direction on a cross-section, for example, a tapered shape in which diameters thereof decrease substantially from an upper side toward a lower side thereof. Each of the plurality of via layers 131, 132, 133, and 134 may include an electroless plating layer (or chemical copper) and an electrolytic plating layer (or electrolytic copper). A sputter layer may be included instead of the electroless plating layer (or chemical copper), and both thereof may be included if necessary.

Each of the first and second solder resist layers 151 and 152 may include solder resist. The solder resist may be a photosensitive material, or may be a liquid type. For example, the solder resist may be a product name of AUS703, SR7300, or the like, but the present disclosure is not limited thereto. The first solder resist layer 151 may have a plurality of openings (h and g), and each or the openings (h and g) may expose at least a portion of an uppermost interconnection layer 121. Each of the openings (h and g) may expose a pattern solder mask defined (SMD) type and/or a non-solder mask defined (NSMD) type, and preferably, expose a pattern in the SMD type. The second solder resist layer 152 may also have a plurality of openings, and each of the openings may expose at least a portion of a lowermost interconnection layer 125. Each of the openings may expose at least a portion of the lowermost interconnection layer 125 in a solder mask defined (SMD) and/or non solder mask defined (NSMD) type, and preferably expose at least a portion of the lowermost interconnection layer 186 in the SMD type.

Meanwhile, each of the insulating layer 111, the interconnection layer 121, and the solder resist layer 151 of the printed circuit board 100A according to an example may be an insulating layer 111 disposed on an uppermost layer among the plurality of insulating layers 111, 112, 113, and 114, an interconnection layer 121 disposed on an uppermost layer among the plurality of interconnection layers 121, 122, 123, 124 and 125, and a first solder resist layer 151 of the first and second solder resist layers 151 and 152 of the printed circuit board 100B according to another example.

Other contents are substantially the same as those described in the printed circuit board 100A according to the example described above, and thus, overlapping contents thereof are omitted.

Figure 8:
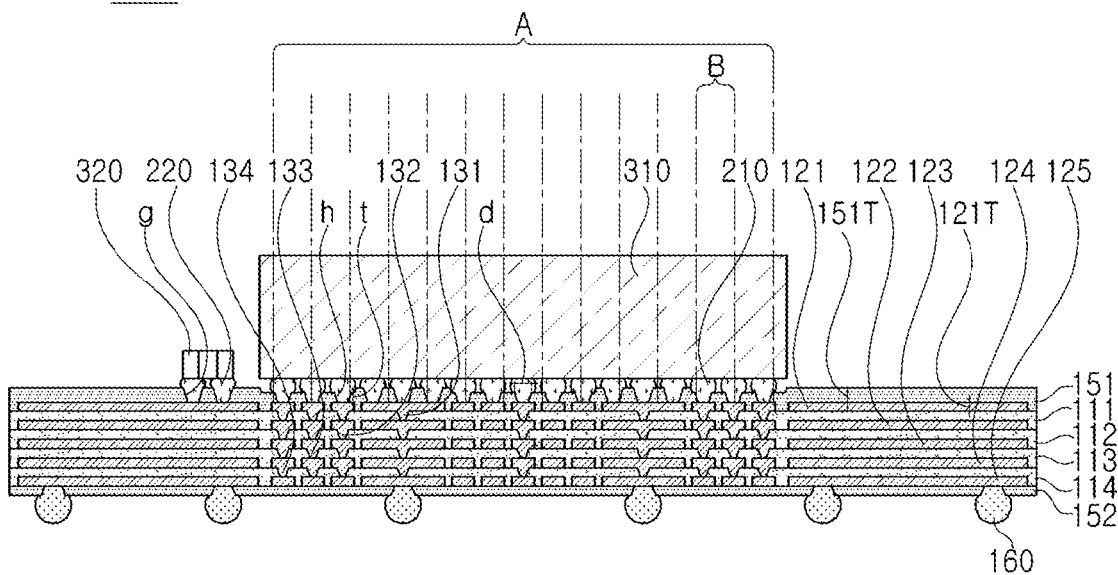
FIG. 8 is a schematic cross-sectional view of a modified example of the printed circuit board of FIG. 7.

FIG. 8 is a schematic cross-sectional view of a modified example of the printed circuit board of FIG. 7.

Referring to FIG. 8, a printed circuit board 500B according to a modified example may include a plurality of insulating layers 111, 112, 113, and 114, a plurality of interconnection layers 121, 122, 123, 124, and 125 respectively disposed on or within the plurality of insulating layers 111, 112, 113, and 114, a plurality of via layers 131, 132, 133, and 134 respectively penetrating at least one of the plurality of insulating layers 111, 112, 113, and 114 and respectively connected to at least one of the plurality of interconnection layers 121, 122, 123, 124, and 125, first and second solder resist layers 151 and 152 respectively disposed on upper sides and lower sides of the plurality of insulating layers 111, 112, 113, and 114, a plurality of solder bumps 210 and 220 respectively disposed on a plurality of openings (h and g) of the first solder resist layer 151 and respectively connected to at least a portion of an exposed portion of an uppermost interconnection layer 121, a semiconductor chip 310 and a passive component 320 disposed on the first solder resist layer 151 and respectively connected to the uppermost interconnection layer 121 through the plurality of solder bumps 210 and 220, and a plurality of electrical connection metal members 160 respectively disposed on a plurality of openings of the second solder resist layer 152 and respectively connected to at least a portion of an exposed portion of a lowermost interconnection layer 125.

The plurality of electrical connection metal members 160 are provided for connecting the printed circuit board 500B to a mainboard, other substrates, or the like, of electronic devices. The plurality of electrical connection metal members 160 may be respectively connected to at least a portion of the lowermost interconnection layer 125. If necessary, the plurality of electrical connection metal members 160 may be respectively disposed through a plurality of under bump metal members. The plurality of electrical connection metal members 160 may be formed of a conductive material, for example, solder, but this is merely an example, and the material is not particularly limited thereto. The plurality of electrical connection metal members 160 may be lands, balls, pins, or the like, respectively. Each of the electrical connection metal members 160 may be formed as a multilayer or a single layer. When the plurality of electrical connection metal 160 are formed as a multilayer, the electrical connection metal members 160 may include a copper pillar and solder formed on the copper pillar, and when the plurality of electrical connection metal 160 are formed as a single layer, the electrical connection metal members 160 may include tin-silver solder or copper, but the present disclosure is not limited thereto.

Other contents are substantially the same as those described in the printed circuit boards 100A, 100B, and 500A, described above, and thus overlapping contents thereof are omitted.

Figure 9:
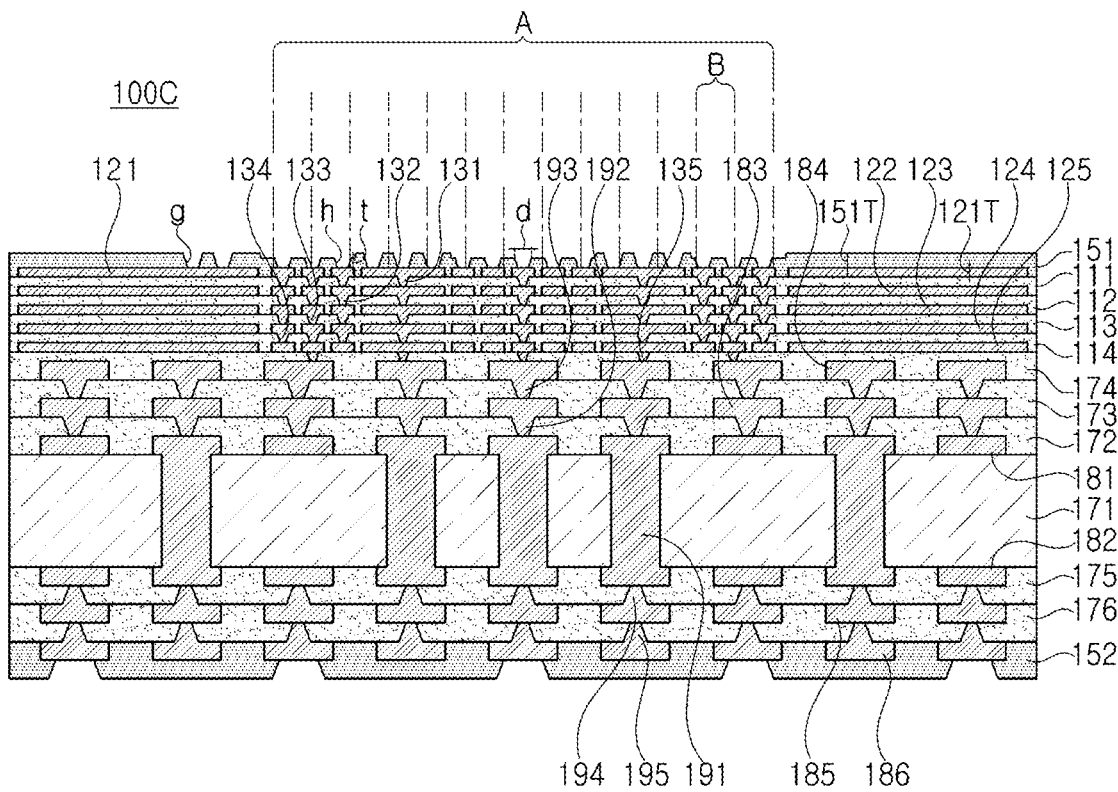
FIG. 9 is a schematic cross-sectional view of another example of a printed circuit board.

FIG. 9 is a schematic cross-sectional view of another example of a printed circuit board.

Referring to FIG. 9, a printed circuit board 100C according to another example may include a core type of first substrate portion 141, a coreless type of second substrate portion 142 disposed on the first substrate portion 141, and first and second solder resist layers 151 and 152 respectively disposed on the first and second substrate portions 141 and 142. The second substrate portion 142 may have interconnection density, higher than that of the first substrate portion 141. For example, the second substrate portion 142 may include high-density interconnection with a relatively finer pitch than the first substrate portion 141, and the first substrate portion 141 may have low-density interconnection relatively lower than the second substrate portion 142. For example, the interconnection of the second substrate portion 142 may have a relatively smaller thickness, line/space, pitch, and the like than the interconnection of the first substrate portion 141. In addition, an insulation distance between interconnections disposed on different layers may be smaller. For example, the printed circuit board 100C may be a 2.nD-type package board.

The first substrate portion 141 may be a core-type multilayer substrate. For example, the first substrate portion 141 may include a core insulating layer 171, first and second core interconnection layers 181 and 182 respectively disposed on an upper surface and a lower surface of the core insulating layer 171, a core via layer 191 penetrating the core insulating layer 171 and connecting the first and second core interconnection layers 181 and 182, a plurality of first buildup insulating layers 172, 173, and 174 disposed on an upper surface of the core insulating layer 171, a plurality of first build-up interconnection layers 183 and 184 respectively disposed on or within the plurality of first build-up insulating layers 172, 173, and 174, a plurality of first build-up via layers 192 and 193 penetrating at least one of the plurality of first build-up insulating layers 172, 173, and 174 and respectively connected to at least one of the plurality of first build-up interconnection layers 183 and 184, a plurality of second build-up insulating layers 175 and 176 disposed on a lower surface of the core insulating layer 171, a plurality of second build-up interconnection layers 185 and 186 respectively disposed of or within the plurality of second build-up insulating layers 175 and 176, and a plurality of second build-up via layers 194 and 195 respectively penetrating at least one of the plurality of second build-up insulating layers 175 and 176 and respectively connected to at least one of the plurality of second build-up interconnection layers 185 and 186.

The core insulating layer 171 may include an insulating material. The insulating material may include a thermosetting resin such as an epoxy resin, a thermoplastic resin such as polyimide, or a material in which these insulating resins are mixed with an inorganic filler such as silica, or the like, or a resin impregnated into a core material such as glass fiber (glass cloth, glass fabric), or the like, together with the inorganic for example, an insulating material such as copper clad laminate (CCL), or the like, but the present disclosure is not limited thereto. The core insulating layer 171 may be formed to be thicker than each of the plurality of first and second build-up insulating layers 172, 173, 174, 175, and 176, but the present disclosure is not limited thereto.

Each of the plurality of first and second build-up insulating layers 172, 173, 174, 175, and 176 may include an insulating material. The insulating material may include a thermosetting resin such as an epoxy resin, a thermoplastic resin such as polyimide, or a material in which these insulating resins are mixed with an inorganic filler such as silica, or the like, or a resin impregnated into a core material such as glass fiber, or the like, together with the inorganic filler, for example, an insulating material such as Ajinomoto Build-up Film (ABF), prepreg, resin coated copper (RCC), or the like, but the present disclosure is not limited thereto. The number of layers of each of the plurality of first and second build-up insulating layers 172, 173, 174, 175, and 176 is not particularly limited.

Each of the first and second core interconnection layers 181 and 182 may include a metal. The metal may include copper (Cu), aluminum (Al), silver (Ag), tin (Sn), gold (Au), nickel (Ni), lead (Pb), titanium (Ti), and/or alloys thereof. Preferably, the metal may include copper (Cu). Each of the first and second core interconnection layers 181 and 182 may include an electroless plating layer (chemical copper) and an electrolytic plating layer (or electrolytic copper), but the present disclosure is not limited thereto. The electroless plating layer may include a sputter layer instead of chemical copper, and include both thereof. If necessary, copper foil may be further included. Each of the first and second core interconnection layers 181 and 182 may perform various functions according to the design of the corresponding layer. For example, it may include a ground pattern, a power pattern, a signal pattern, and the like. Each of these patterns may include a line pattern, a plane pattern, and/or a pad pattern.

Each of the plurality of first and second build-up interconnection layers 183, 184, 185, and 186 may include a metal. The metal may include copper (Cu), aluminum (Al), silver (Ag), tin (Sn), gold (Au), nickel (Ni), lead (Pb), titanium (Ti), and/or alloys thereof. Preferably, the metal may include copper (Cu). Each of the plurality of first and second build-up interconnection layers 183, 184, 185, and 186 may include an electroless plating layer (chemical copper) and an electrolytic plating layer (or electrolytic copper), but the present disclosure is not limited thereto. The electroless plating layer may include a sputter layer instead of chemical copper, and include both thereof. If necessary, copper foil may be further included. Each of the first and second build-up interconnection layers 183, 184, 185, and 186 may perform various functions according to the design of the corresponding layer. For example, it may include a ground pattern, a power pattern, a signal pattern, and the like. Each of these patterns may include a line pattern, a plane pattern, and/or a pad pattern.

The core via layer 191 may include a through-via. The through-via may include a metal layer formed on a wall surface of the through-hole and a plug filling the metal layer. The metal layer may include copper (Cu), aluminum (Al), silver (Ag), tin (Sn), gold (Au), nickel (Ni), lead (Pb), titanium (Ti), and/or alloys thereof. Preferably, the metal layer may include copper (Cu). The plug may include ink formed of an insulating material. The metal layer may include an electroless plating layer (or chemical copper) and an electrolytic plating layer (or electrolytic copper), but the present disclosure is not limited thereto. The electroless plating layer may include a sputter layer instead of chemical copper, and include both thereof, If necessary. The core via layer 191 may perform various functions according to the design. For example, the core via layer 191 may include a ground via, a power via, a signal via, and the like. The core via layer 191 may have a substantially cylindrical shape, but the present disclosure is not limited thereto, and may have a substantially hourglass shape.

Each of the plurality of first and second build-up via layers 192, 193, 194, and 195 may include a micro via. The micro via may be a filled via filling a via hole, or a conformal via disposed along a wall surface of the via hole. The micro via may be disposed in a stacked type and/or a staggered type.

Each of the plurality of first and second build-up via layers 192, 193, 194, and 195 may include a metal. The metal may include copper (Cu), aluminum (Al), silver (Ag), tin (Sn), gold (Au), nickel (Ni), lead (Pb), titanium (Ti), and/or alloys thereof. Preferably, the metal may include copper (Cu). Each of the plurality of first and second build-up via layers 192, 193, 194, and 195 may include an electroless plating layer (or chemical copper) and an electrolytic plating layer (or electrolytic copper), but the present disclosure is not limited thereto. The electroless plating layer may include a sputter layer instead of chemical copper, and include both thereof. Each of the plurality of first and second build-up via layers 192, 193, 194, and 195 may perform various functions according to the design of the corresponding layer. For example, it may include a ground via, a power via, a signal via, and the like. The vias of the plurality of first build-up via layers 192 and 193 and the vias of the plurality of second build-up via layers 194 and 195 may have tapered shapes in opposite directions. The second substrate portion 142 may be a coreless-type multilayer build-up substrate including a microcircuit. For example, the second substrate portion 142 may include a plurality of third build-up insulating layers 111, 112, 113, and 114, a plurality of third build-up interconnection layers 121, 122, 123, 124, and 125 respectively disposed on or in the plurality of third build-up insulating layers 111, 112, 113, and 114, and a plurality of third build-up via layers 131, 132, 133, 134, and 135 respectively penetrating at least one of the plurality of third build-up insulating layers 111, 112, 113, and 114 and respectively connected to at least one of the plurality of third build-up interconnection layers 121, 122, 123, 124, and 125.

Each of the plurality of third build-up insulating layers 111, 112, 113, and 114 may include an insulating material. The insulating material may include a thermosetting resin such as an epoxy resin, a thermoplastic resin such as polyimide, or a material in which these insulating resins are mixed with an inorganic filler such as silica, or the like, or a resin impregnated into a core material such as glass fiber, or the like, together with the inorganic filler, for example, an insulating material such as Ajinomoto Build-up Film (ABF), prepreg, resin coated copper (RCC), or the like, but the present disclosure is not limited thereto. The number of layers of the plurality of third build-up insulating layers 111, 112, 113, and 114 is not particularly limited.

Each of the plurality of third build-up interconnection layers 121, 122, 123, 124, and 125 may include a metal. The metal may include copper (Cu), aluminum (Al), silver (Ag), tin (Sn), gold (Au), nickel (Ni), lead (Pb), titanium (Ti), and/or alloys thereof. Preferably, the metal may include copper (Cu). Each of the plurality of third build-up interconnection layers 121, 122, 123, 124, and 125 may include an electroless plating layer (chemical copper) and an electrolytic plating layer (or electrolytic copper), but the present disclosure is not limited thereto. The electroless plating layer may include a sputter layer instead of chemical copper, and include both thereof. If necessary, copper foil may be further included. Each of the plurality of third build-up interconnection layers 121, 122, 123, 124, and 125 may perform various functions according to the design of the corresponding layer. For example, it may include a ground pattern, a power pattern, a signal pattern, and the like. Each of these patterns may include a line pattern, a plane pattern, and/or a pad pattern.

Each of the plurality of third build-up via layers 131, 132, 133, 134, and 135 may include a micro via. The micro via may be a filled via filling a via hole, or a conformal via disposed along a wall surface of the via hole. The micro via may be disposed in a stacked type and/or a staggered type. Each of the plurality of third build-up via layers 131, 132, 133, 134, and 135 may include a metal, and the metal may include copper (Cu), aluminum (Al), silver (Ag), tin (Sn), gold (Au), nickel (Ni), lead (Pb), titanium (Ti), and/or alloys thereof. Preferably, the metal may include copper (Cu). Each of the plurality of third build-up via layers 131, 132, 133, 134, and 135 may include an electroless plating layer (or chemical copper) and an electrolytic plating layer (or electrolytic copper), but the present disclosure is not limited thereto. The electroless plating layer may include a sputter layer instead of chemical copper, and include both thereof. The vias of the plurality of third build-up via layers 131, 132, 133, 134, and 135 may have a tapered shape in the same direction as each other. The vias of the plurality of the plurality of third build-up via layers 131, 132, 133, 134, and 135 may have a tapered shape in the same direction as the vias of the plurality of first build-up via layers 192 and 193, and may have a tapered shape opposite to that of the vias of the second build-up via layers 194 and 195.

Each of the first and second solder resist layers 151 and 152 may include solder resist the solder resist may be a photosensitive material, or may be a liquid type. For example, the solder resist may be a product name of AUS703, SR7300, or the like, but the present disclosure is not limited thereto. The first solder resist layer 151 may have a plurality of openings (h and g), and each of the openings (h and g) may expose at least a portion of the uppermost third build-up interconnection layer 121. Each of the openings (h and g) may expose at least a portion of the uppermost third build-up interconnection layer 121 in a solder mask defined (SMD) and/or non-solder mask defined (NSMD) type, and preferably expose at least a portion of the uppermost third build-up interconnection layer 121 in the SMD type. The second solder resist layer 152 may also have a plurality of openings, and each of the openings may expose at least a portion of a lowermost second build-up interconnection layer 186. Each of the openings may expose at least a portion of the lowermost second build-up interconnection layer 186 in a solder mask defined (SMD) and/or non-solder mask defined (NSMD) type, and preferably expose at least a portion of the lowermost second build-up interconnection layer 186 in the SMD type.

Meanwhile, each of the insulating layer 111, the interconnection layer 121, and the solder resist layer 151 of the printed circuit board 100A according to an example may be an uppermost third build-up insulating layer 111 among the plurality of third build-up insulating layers 111, 112, 113, and 114, an uppermost third build-up interconnection layer 121 among the plurality of third build-up interconnection layers 121, 122, 123, 124, and 125, and a first solder resist layer 151 among the first and second solder resist layers 151 and 152, of the plurality of printed circuit board 100C according to another example.

Other contents are substantially the same as those described in the printed circuit board 100A according to the above-described example, and therefore, redundant contents thereof are omitted.

Figure 10:
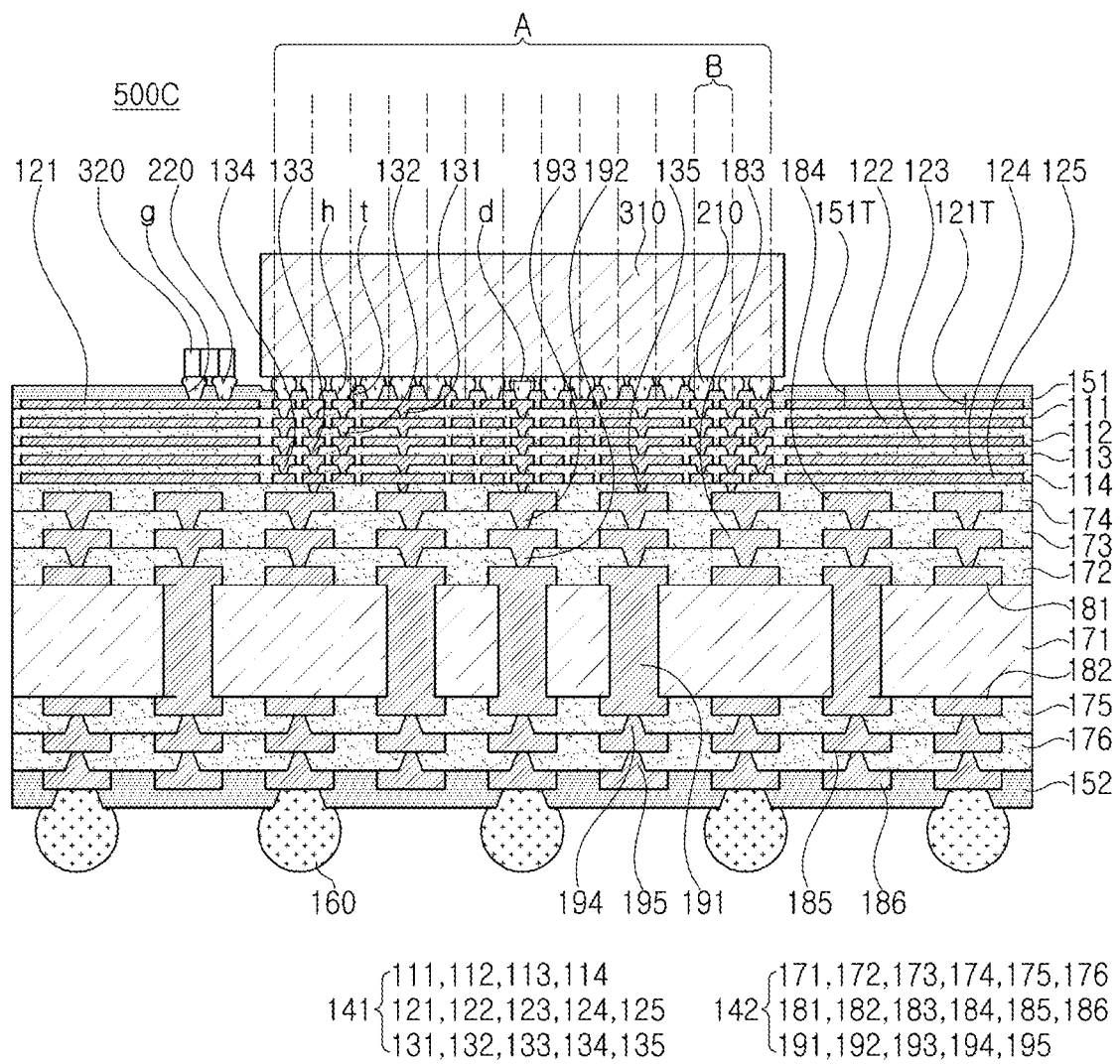
FIG. 10 is a schematic cross-sectional view of a modified example of the printed circuit board of FIG. 9.

FIG. 10 is a schematic cross-sectional view of a modified example of the printed circuit board of FIG. 9.

Referring to FIG. 10, a printed circuit board 500C according to a modified example may include a core-type of first substrate portion 141, a coreless-type of second substrate portion 142 disposed on the first substrate portion 141, first and second solder resist layers 151 and 152 respectively disposed on the first and second substrate portions 141 and 142, a plurality of solder bumps 210 and 220 respectively disposed on a plurality of openings (h and g) of the first solder resist layer 151 and respectively connected to at least a portion of an exposed uppermost third build-up interconnection layer 121, a semiconductor chip 310 disposed on the first solder resist layer 151 and respectively connected to the uppermost interconnection layer 121 through a plurality of solder bumps 210 and 220, and a plurality of electrical connection metal members 160 respectively disposed on a passive component 320 and a plurality of openings of the second solder resist layer 152 and respectively connected to at least a portion of an exposed lowermost second build-up interconnection layer 186. For example, the printed circuit board 500C according to the modified example may have a package form including the printed circuit board 100C according to another example. For example, the printed circuit board 500C may have a semiconductor package structure.

The plurality of electrical connection metal members 160 are a configuration for connecting the printed circuit board 500C to a mainboard, other substrates, or the like, of electronic devices. The plurality of electrical connection metal members 160 may be respectively connected to the at least a portion of a lowermost third build-up interconnection layer 186. If necessary, the plurality of electrical connection metal members 160 may be respectively disposed through a plurality of under bump metal members. The plurality of electrical connection metal members 160 may be formed of a conductive material, for example, solder, but this is merely an example, and the material is not particularly limited thereto. The plurality of electrical connection metal members 160 may be lands, balls, pins, or the like, respectively. Each of the electrical connection metal members 160 may be formed as a multilayer or a single layer. When the plurality of electrical connection metal 160 are formed as a multilayer, the electrical connection metal members 160 may include a copper pillar and solder formed on the copper pillar, and when the plurality of electrical connection metal 160 are formed as a single layer, the electrical connection metal members 160 may include tin-silver solder or copper, but the present disclosure is not limited thereto.

Other contents are substantially the same as those described in the above-described printed circuit boards 100A, 100C, and 500A, and thus redundant contents thereof are omitted.

In the present disclosure, it may mean substantially including minute differences due to process errors, and the like. For example, a substantially straight line may include a substantially straight line as well as a completely straight line. In addition, a substantially rectangular shape may include a substantially rectangular shape as well as a completely rectangular shape. In addition, substantially equal may include not only completely equal, but also approximately equal.

In the present disclosure, the meaning of "in a cross-section" may mean a cross-sectional shape when an object is vertically cut, or a cross-sectional shape when the object is viewed from a side-view. In addition, the meaning of "on a plane" may be a shape when the object is horizontally cut, or a planar shape when the object is viewed from a top-view or a bottom-view.

In the present disclosure, a lower side, a lower portion, a lower surface, and the like, may be used to mean a direction toward a mounting space of a semiconductor package including an organic interposer, based on a cross-section of the drawing for convenience, and an upper side, an upper portion, an upper surface, and the like may be used to mean a direction opposite thereto. However, this is defined as a direction for convenience of explanation, and the scope of the claims is not particularly limited by the description of this direction.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second,"

and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and does not necessarily refer to the same embodiment. Furthermore, the particular characteristics or features may be combined in any suitable manner in one or more embodiments. For example, a context described in a specific exemplary embodiment maybe used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of the various effects of the present disclosure, a printed circuit board capable of improving process capability by securing flatness of a bump region may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
   an insulating layer;
   an interconnection layer disposed on the insulating layer, and including a plurality of metal pads for mounting a semiconductor chip thereon; and
   a solder resist layer disposed on the insulating layer and covering the interconnection layer, the solder resist layer having a plurality of openings respectively exposing at least a portion of at least one of the plurality of metal pads,
   wherein a rectangular region created by substantially connecting outer edges of outermost openings among the plurality of openings in a straight line is substantially equally divided into a plurality of cells, and a ratio of areas of the metal pads disposed in each cell to an area of each cell is calculated, and when a maximum value thereof is $P_{Max}$ and a minimum value thereof is $P_{Min}$, $(P_{Max}-P_{Min})*100 \leq 20$.

2. The printed circuit board of claim 1, wherein the plurality of cells are equally divided within a range having a horizontal length of 1.7 mm to 2.0 mm and a vertical length of 1.7 mm to 2.0 mm.

3. The printed circuit board of claim 1, wherein when an average depth of the openings in each of the plurality of cells is $t_1, t_2, \ldots t_n$, respectively, and a ratio of an area in each of the plurality of cells is $P_1, P_2, \ldots P_n$, respectively, where n is an integer equal to or greater than 3, $t_1, t_2, \ldots t_n$ substantially satisfy a relationship of $0.22*\{(P_1, P_2, \ldots P_n)*100\}*(\mu m)+m*(\mu m)$, respectively, where, m is a rational number equal to or greater than 0.

4. The printed circuit board of claim 1, wherein an average thickness of the interconnection layer is 10 μm to 18 μm, and a difference between a maximum thickness and a minimum thickness in the interconnection layer is within 5 μm.

5. The printed circuit board of claim 1, wherein an average thickness of the solder resist layer is 15 μm to 23 μm, and a difference between a maximum thickness and a minimum thickness in the solder resist layer is within 7 μm.

6. The printed circuit board of claim 1, wherein an average diameter of the plurality of openings is 50 μm to 100 μm, and a difference in diameters between an opening having a maximum diameter and an opening having a minimum diameter among the plurality of openings is within 10 μm.

7. The printed circuit board of claim 1, wherein each of the plurality of metal pads comprises copper (Cu).

8. The printed circuit board of claim 1, wherein the solder resist layer comprises a solder resist made of a photosensitive material.

9. The printed circuit board of claim 1, wherein the plurality of openings respectively expose at least the portion of the at least one of the plurality of pads in a solder mask defined (SMD) type.

10. The printed circuit board of claim 1, wherein the printed circuit board comprises a plurality of insulating layers, a plurality of interconnection layers respectively disposed on or within the plurality of insulating layers, and a plurality of via layers respectively penetrating at least one of the plurality of insulating layers and respectively connected to at least one of the plurality of interconnection layers,
   the solder resist layer is disposed on the plurality of insulating layers,
   the insulating layer, on which the interconnection layer including the plurality of metal pads is disposed, is an outermost layer among the plurality of insulating layers, and
   the interconnection layer including the plurality of metal pads is an outermost layer among the plurality interconnection layers.

11. The printed circuit board of claim 1, further comprising a first substrate portion and a second substrate portion disposed on the first substrate portion,
   wherein the second substrate portion has higher interconnection density than the first substrate portion,
   the solder resist layer is disposed on the second substrate portion, and
   the insulating layer and the interconnection layer are disposed as an outermost layer of the second substrate portion, respectively.

12. The printed circuit board of claim 11, wherein the first substrate portion comprises a core insulating layer, first and second core interconnection layers respectively disposed on both surfaces of the core insulating layer, a core via layer penetrating the core insulating layer and connecting the first and second core interconnection layers, a plurality of first and second build-up insulating layers respectively disposed on the both surfaces of the core insulating layer, a plurality of first build-up interconnection layers respectively disposed on or within the plurality of first build-up insulating layers, a plurality of first build-up via layers respectively penetrating at least one of the plurality of first build-up insulating layers and respectively connected to at least one of the plurality of first build-up interconnection layers, a plurality of second build-up interconnection layers respectively disposed on or within the plurality of second build-up insulating layers, and a plurality of second build-up via layers respectively penetrating at least one of the plurality of second build-up insulating layers and respectively connected to at least one of the plurality of second build-up interconnection layers, wherein the second substrate portion comprises a plurality of third build-up insulating layers, a plurality of third build-up interconnection layers respectively disposed on or within the plurality of third build-up insulating layers, and a plurality of third build via layers respectively penetrating at least one of the plurality of third build-up insulating layers and respectively connected to at least one of the plurality of third build-up interconnection layers, wherein the solder resist layer is disposed on the plurality of third build-up insulating layers, wherein the insulating layer is an outermost layer among the plurality of third build-up insulating layers, wherein the interconnection layer is an outermost layer among the plurality of third build-up interconnection layers.

13. A printed circuit board, comprising:
an insulating portion;
a plurality of metal pads disposed on the insulating portion, and for mounting a semiconductor chip thereon; and
a first solder resist layer disposed on the insulating portion and covering the plurality of metal pads, the first solder resist layer having a plurality of first openings respectively exposing at least a portion of at least one of the plurality of metal pads,
wherein a rectangular region created by substantially connecting outer edges of outermost first openings among the plurality of first openings in a straight line is substantially equally divided into n cells within a range having a horizontal length of 1.7 mm to 2.0 mm and a vertical length of 1.7 mm to 2.0 mm, and a ratio of areas of the metal pads disposed in each cell to a total area of the rectangular region is calculated, and when a maximum value thereof is $Q_{Max}$ and a minimum value thereof is $Q_{Min}$, $n*(Q_{Max}-Q_{Min})*100 \leq 20$, where n is a positive integer.

14. The printed circuit board of claim 13, wherein when an average depth of the first openings in each of the plurality of cells is $t_1, t_2, \ldots t_n$, respectively, and a ratio of an area of the metal pads disposed in each cell to the total area of the rectangular region is $Q_1, Q_2, \ldots Q_n$, respectively, where n is an integer equal to or greater than 3, $t_1, t_2, \ldots t_n$ substantially satisfies a relationship of $0.22*n*\{(Q_1, Q_2, \ldots Q_n)*100\}*(\mu m)+k*(\mu m)$, respectively, where k is a rational number equal to or greater than 0.

15. The printed circuit board of claim 13, wherein an average thickness of the plurality of metal pads is 10 μm to 18 μm, and
a difference in thicknesses between a metal pad having a maximum thickness and a metal pad having a minimum thickness among the plurality of metal pads is within 5 μm.

16. The printed circuit board of claim 13, wherein an average thickness of the first solder resist layer is 15 μm to 23 μm, and
a difference between a maximum thickness and a minimum thickness in the first solder resist layer is within 7 μm.

17. The printed circuit board of claim 13, wherein an average diameter of the plurality of first openings is 50 μm to 100 μm, and a difference in diameters between a first opening having a maximum diameter and a first opening having a minimum diameter among the plurality of first openings is within 10 μm.

18. The printed circuit board of claim 13, further comprising:
a plurality of interconnection layers respectively disposed on or within the insulating portion,
wherein an interconnection layer disposed on an uppermost layer among the plurality of interconnection layers includes the plurality of metal pads.

19. The printed circuit board of claim 18, further comprising:
a plurality of solder bumps respectively disposed on the plurality of first openings, and respectively connected to at least the portion of the at least one of the plurality of metal pads; and
a semiconductor chip disposed on the first solder resist layer, and connected to the plurality of metal pads through the plurality of solder bumps.

20. The printed circuit board of claim 19, further comprising:
a second solder resist layer disposed on a side opposite to a side of the insulating portion on which the first solder resist layer is disposed, the second solder resist layer having a plurality of second openings respectively exposing at least a portion of an interconnection layer disposed on a lowermost layer among the plurality of interconnection layers; and
a plurality of electrical connection metal members respectively disposed on the plurality of second openings, and respectively connected to at least the portion of the interconnection layer disposed on the lowermost layer thereof.

21. A printed circuit board, comprising:
an insulating layer;
an interconnection layer disposed on the insulating layer, and including a plurality of metal pads for mounting a semiconductor chip thereon; and
a solder resist layer disposed on the insulating layer and covering the interconnection layer, the solder resist layer having a plurality of openings respectively exposing at least a portion of at least one of the plurality of metal pads,
wherein a rectangular region created by substantially connecting outer edges of outermost openings among the plurality of openings in a straight line is substantially equally divided into a plurality of cells, an average depth of the openings in each of the plurality of cells is $t_1, t_2, \ldots t_n$, respectively, and a ratio of an area of the metal pads disposed in each cell to an area of each cell are $P_1, P_2, \ldots P_n$, respectively, where n is an integer equal to or greater than 3, $t_1, t_2, \ldots t_n$ substantially satisfy a relationship of $0.22*\{(P_1, P_2, \ldots P_n)*100\}*(\mu m)+m*(\mu m)$, respectively, where, m is a rational number equal to or greater than 0.

22. The printed circuit board of claim 21, wherein the plurality of cells are equally divided within a range having a horizontal length of 1.7 mm to 2.0 mm and a vertical length of 1.7 mm to 2.0 mm.

23. The printed circuit board of claim 21, wherein an average thickness of the interconnection layer is 10 μm to 18 μm, and
a difference between a maximum thickness and a minimum thickness in the interconnection layer is within 5 μm.

24. The printed circuit board of claim 21, wherein an average thickness of the solder resist layer is 15 μm to 23 μm, and
  a difference between a maximum thickness and a minimum thickness in the solder resist layer is within 7 μm.

25. The printed circuit board of claim 21, wherein an average diameter of the plurality of openings is 50 μm to 100 μm, and
  a difference in diameters between an opening having a maximum diameter and an opening having a minimum diameter among the plurality of openings is within 10 μm.

26. The printed circuit board of claim 21, wherein the plurality of openings respectively expose at least the portion of the at least one of the plurality of pads in a solder mask defined (SMD) type.

27. A printed circuit board, comprising:
  an insulating portion;
  a plurality of metal pads disposed on the insulating portion, and for mounting a semiconductor chip thereon; and
  a solder resist layer disposed on the insulating portion and covering the plurality of metal pads, the solder resist layer having a plurality of openings respectively exposing at least a portion of at least one of the plurality of metal pads,
  wherein a rectangular region created by substantially connecting outer edges of outermost openings among the plurality of openings in a straight line is substantially equally divided into n cells within a range having a horizontal length of 1.7 mm to 2.0 mm and a vertical length of 1.7 mm to 2.0 mm, an average depth of the openings in each of the plurality of cells is $t_1, t_2, \ldots t_n$, respectively, and a ratio of an area of the metal pads disposed in each cell to the total area of the rectangular region is $Q_1, Q_2, \ldots Q_n$, respectively, where n is an integer equal to or greater than 3, $t_1, t_2, \ldots t_n$ substantially satisfies a relationship of $0.22*n*\{(Q_1, Q_2, \ldots Q_n)*100\}*(\mu m)+k*(\mu m)$, respectively, where k is a rational number equal to or greater than 0.

28. The printed circuit board of claim 27, wherein an average thickness of the plurality of metal pads is 10 μm to 18 μm, and
  a difference in thicknesses between a metal pad having a maximum thickness and a metal pad having a minimum thickness among the plurality of metal pads is within 5 μm.

29. The printed circuit board of claim 27, wherein an average thickness of the solder resist layer is 15 μm to 23 μm, and
  a difference between a maximum thickness and a minimum thickness in the solder resist layer is within 7 μm.

30. The printed circuit board of claim 27, wherein an average diameter of the plurality of openings is 50 μm to 100 μm, and
  a difference in diameters between a opening having a maximum diameter and a opening having a minimum diameter among the plurality of openings is within 10 μm.

31. A method to determine whether a printed circuit board is suitable for a semiconductor chip mounted thereon, wherein the printed circuit board includes an insulating layer, a plurality of metal pads disposed on the insulating layer, and a solder resist layer disposed on the insulating layer and having a plurality of openings respectively exposing at least a portion of at least one of the plurality of metal pads, the method comprising:
  substantially equally dividing a rectangular region created by substantially connecting outer edges of outermost openings among the plurality of openings in a straight line into a plurality of cells;
  calculating a ratio of areas of the metal pads disposed in each cell to an area of each cell; and
  determining that the printed circuit board is suitable for the semiconductor chip mounted thereon based on a result that $(P_{Max}-P_{Min})*100$ is equal to or less than a predetermined value, where $P_{Max}$ is a maximum value among the ratios for the plurality of cells and $P_{Min}$ is a minimum value among the ratios for the plurality of cells.

32. The method of claim 31, wherein the predetermined value is 20.

* * * * *